United States Patent [19]

Cheng

[11] Patent Number: 6,020,268
[45] Date of Patent: Feb. 1, 2000

[54] MAGNETIC FIELD CONTROLLED SPACER WIDTH

[75] Inventor: Min-Chih Cheng, Taipei, Taiwan

[73] Assignee: Taiwan Semiconductor Manufacturing Company, Ltd., Hsin-Chu, Taiwan

[21] Appl. No.: 09/114,126

[22] Filed: Jul. 13, 1998

[51] Int. Cl.[7] .................................................. H01L 21/00
[52] U.S. Cl. .................... 438/714; 438/723; 438/732; 438/743
[58] Field of Search .................................. 438/714, 723, 438/728, 732, 743; 156/345 ME, 345 MG; 216/67, 70, 76, 79

[56] References Cited

U.S. PATENT DOCUMENTS

| 4,786,361 | 11/1988 | Sekine et al. | 156/345 X |
| 5,021,121 | 6/1991 | Groechel et al. | 156/643 |
| 5,242,538 | 9/1993 | Hamrah et al. | 156/643 |

OTHER PUBLICATIONS

Chang et al. "ULSI Technology". The McGraw–Hill Companies Inc, 1996. p346–349.

*Primary Examiner*—William Powell
*Attorney, Agent, or Firm*—George O. Saile; Stephen B. Ackerman

[57] ABSTRACT

In this invention is described a process for controlling the etching of side wall spacers to a prescribed width. A gaseous mixture of an inert gas, $CF_4$ and $CHF_3$ in a prescribed ratio, under pressure and with a plasma is flowed within a RIE chamber. A magnetic field in parallel with the surface of the wafer being etched is used to control the oxide/silicon selectivity. The shape and width of the side wall spacers are controlled by controlling the selectivity. Uniformity of the shape of side wall spacers over the surface of a wafer is also produced by the magnetic field which induces a higher etch rate at the edge of the wafer where the oxide coating is the thickest.

10 Claims, 3 Drawing Sheets

| Gas Ratio R | 7 | 3.8 |
|---|---|---|
| Selectivity S (Ox/Si) | 20.42 | 15.4 |
| Isat-Pl (ma) | 1.462 | 1.53 |

Pressure P=120mT; Magnetic Field B=25G
Flow rate 120 sccm

*FIG. 2a*

| Pressure P | 120mT | 90mT |
|---|---|---|
| Selectivity S (Ox/Si) | 20.42 | 19.7 |
| Isat-Pl (ma) | 1.462 | 1.478 |

R=7; B Field=25G, Flow rate 120 sccm

*FIG. 2b*

| Magnetic Field B | 25G | 15G | 0G |
|---|---|---|---|
| Selectivity S (Ox/Si) | 20.42 | 20.98 | 22.00 |
| Isat-Pl (ma) | 1.462 | 1.517 | |
| Spacer Width W | 1292A | 1200A | 1160A |

R=7; P=120mT, Flow rate 120 sccm

*FIG. 2c*

MAGNETIC FIELD CONTROLLED SPACER WIDTH

BACKGROUND OF THE INVENTION

1. Field of Invention

This invention relates to semiconductor process and more particularly to etching silicon dioxide for forming side wall spacers on gate structures.

2. Description of Related Art

The art of etching openings or side walls in an insulator like silicon dioxide can be accomplished with near vertical side walls. This is accomplished through a highly selective process that has a high preference to etching silicon dioxide. The selectivity of the process can be varied by varying the chemistry and pressure of the process. Control of the steepness of the side walls of an opening into the silicon dioxide is less than perfect using the mixture of gases or pressure of the process.

In U.S. Pat. No. 5,021,121 (Groechel et al.) an improved RIE process is disclosed for etching holes in a layer of silicon dioxide with a high contact angle using a highly selective process. A mixture of an inert gas along with $CHF_3$ and $CF_4$ is flowed into a RIE chamber and the wafers being processed are subjected to a magnetic field parallel to the surface of the wafers. In U.S. Pat. No. 5,242,538 (Hamrah et al.) a RIE etch process is disclosed including hydrogen radicals. Addition of these hydrogen radicals, such as ammonia or methane, in amounts from about 5 to about 20 percent will increase the oxide etch rate while suppressing the polysilicon etch rate. C. Y. Chang and S. M. Sze in "ULSI Technology" by McGraw-Hill Company, INC., copyright 1997, pp 346–349 discusses oxide etch process using magnetic fields.

Although the selectivity for etching $SiO_2$ can be controlled by the gas ratio of $CF_4$ to $CHF_3$ or the pressure being maintained within the etching chamber, they do not provide a fine vernier by which the width of a side wall spacer can be easily controlled. Also uniformity across a wafer as a result of non-uniform coating of the oxide material cannot be corrected with either the etching gasses or the chamber pressure. The use of a magnetic field parallel to the surface of the wafer being etched produces an etch rate that is higher at the edge of the wafer. Thus compensating for the non-uniformity of the oxide coating of the wafer that is to be etched by enhancing the etch rate at the edge of the wafer compared to the center. Controlling the intensity of the magnetic field permits a fine control of the selectivity for the preference for etching oxide versus silicon. The use of a controlled magnetic field produces well defined side wall spacers of a prescribed width with improved uniformity over the surface of a wafer.

SUMMARY OF THE INVENTION

This invention describes a process for controlling the selectivity of the etching of a wafer to produce well controlled side wall spacers on gates of semiconductor transistors with a prescribed spacer width and improved spacer uniformity over the surface of the wafer. This is accomplished by placing a wafer into an environment of a plasma in a mixture of gases, flowing at a prescribed rate, under a controlled pressure, and with a magnetic field being applied across the semiconductor wafer.

The mixture of gases comprising an inert gas and $CF_4$ and $CHF_3$ at a prescribed ratio is flowed over the semiconductor wafer under pressure and with a plasma sustained within the gas. A magnetic field is applied in parallel to the surface of the semiconductor wafer. The magnitude of the magnetic field is adjusted to control the selectivity of the oxide to silicon etching rate which in turn produces a well defined side wall spacer width with improved uniformity over the surface of the wafer. The highest oxide/silicon selectivity is when there is no applied magnetic field; therefore, a high selectivity needs to be established, through the control of the ratio of $CF_4$ and $CHF_3$ and the pressure within the etching chamber to produce adequate selectivity when the magnetic field is applied. The magnetic field provides a better vernier for the control of selectivity than the other process parameters because the magnitude of the magnetic field can be closely controlled, and the sensitivity of the selectivity parameter to a change in the magnitude of the magnetic field is lower than with the other process elements.

When the oxide from which the side wall spacers are etched is applied to the wafer, the thickness of the oxide is higher at the edge of the semiconductor wafer than the center. The magnetic field induces a higher etch rate at the edge of the wafer which compensates for the lack uniformity of the oxide by etching the thicker oxide at the edge more than that found in the center of the wafer. This improves the uniformity of the etched side wall spacers across the surface of the wafer.

BRIEF DESCRIPTION OF THE DRAWINGS

This invention will be described with reference to the accompanying drawings, wherein:

FIG. 2a is a chart shows the effect of the gas ratio on etching selectivity and plasma current;

FIG. 2b is a chart that shows the effect of pressure on etching selectivity and plasma current;

FIG. 2c is a chart that shows the effect of magnitude of the magnetic field on etching selectivity, plasma current and the side wall spacer width.

DETAILED DESCRIPTION OF THE PREFERRED EMBODIMENT

Figure 1A:
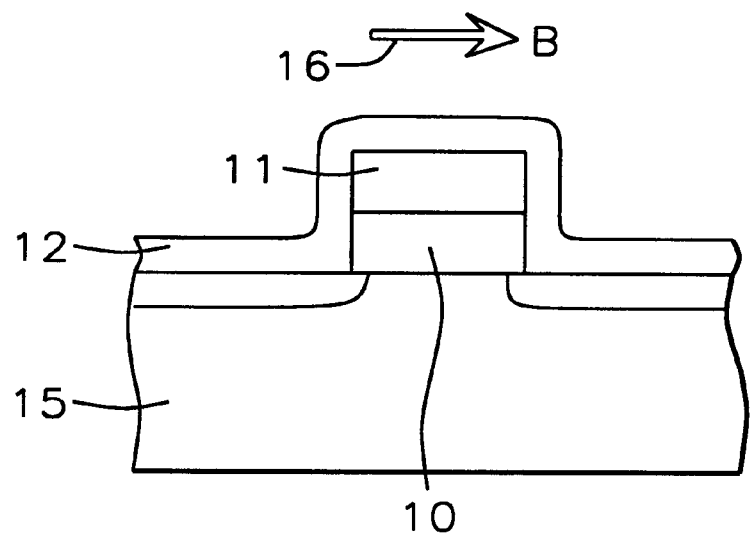
FIG. 1a is a cross section view of a gate structure on a wafer substrate with a coating of silicon dioxide.

In FIG. 1a is shown a cross section view of a semiconductor gate structure on a substrate 15. The gate structure is comprised of an insulator layer 11 over a layer of polysilicon 10. Covering the wafer including the gate structure is a coating of silicon dioxide ($SiO_2$). A magnetic field B 16 is shown in a direction parallel to the surface of the semiconductor wafer. The intensity of the magnetic field 16 is adjusted to control the selectivity of the oxide to silicon etch rate which controls the steepness of the side walls 14 and the side wall width 13 shown in FIG. 1b.

Figure 1B:
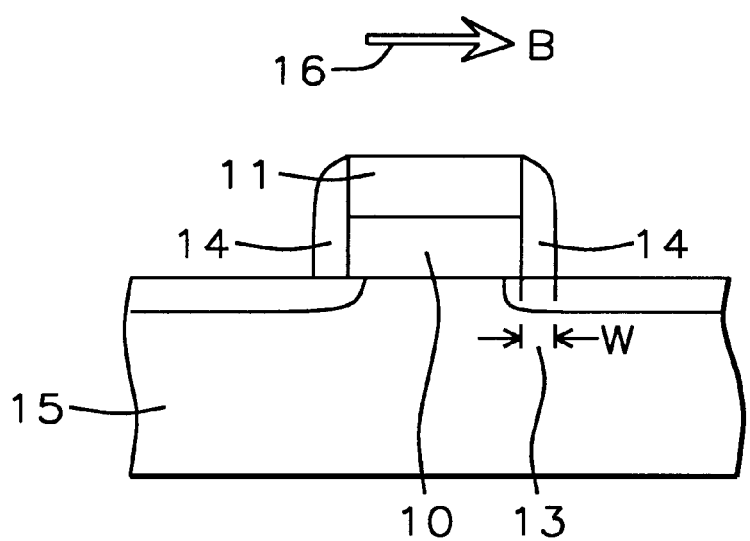
FIG. 1b is a cross section view of the gate structure with formed side wall spacers.

Shown in FIG. 1b is a semiconductor substrate 15 with a transistor gate structure comprising a layer of polysilicon 10 and an insulating layer 11 with formed side walls 14. The side walls 14 extend from the top of the insulating layer 11 to the bottom of the polysilicon layer 10. The width W 13 and shape of the side walls 14 are controlled by the etching environment. When the oxide being etched was originally applied to the wafer, the thickness at the edge of the wafer was thicker than at the center. In the presence of the magnetic field the etch rate at the edge of the wafer is higher than at the center, thus compensating for the variation in thickness of the oxide. By adjusting the magnetic field 16 the selectivity of the etching process can be controlled to produce the desired side wall width 13 uniform over the surface of the wafer.

In FIG. 2a is shown a chart of the gas ratio R of $CF_4$ and $CHF_3$ use to etch the $SiO_2$ coating 12, shown in FIG. 1a, versus the oxide/silicon selectivity and the plasma current Isat-Pl for a pressure P=120 mT, a magnetic field intensity B=25 G and a gas mixture flow rate of 120 sccm. At a low gas ratio (3.8) a relatively poor selectivity (15.4) is obtained at a high plasma current (1.53 ma). This lower gas ratio (3.8) will produce shallower slopes and wider spacer widths. At a gas ratio R=7 a better selectivity (20.42) is produced, yielding a better shaped side wall spacer.

In FIG. 2b is shown the effect of pressure on selectivity for a gas ratio R=7, a magnetic field intensity B=25 G and a flow rate of 120 sccm. At a gas pressure P=90 mT the selectivity is somewhat worse than at a gas pressure P=120 mT. The same is true for the plasma current that varies slightly between the two pressures.

In FIG. 2c is shown a chart that shows the effects of varying the magnetic field (B Field) while holding constant the gas ratio R=7, the pressure P=120 mT and the flow rate at 120 sccm. The oxide/silicon selectivity ranges from S=22 for B=0 G to S=20.42 for a B=25 G. The side wall spacer width varies from W=1160 Angtrom for B=0 G to W=1292 Angstrom for B=25 G. For a selected spacer width W=1292, a gas ratio R=7 and a pressure P=120 mT is required with a magnetic filed set at B=25 G and drawing a plasma current Isat-Pl=1.462 ma.

Figure 3:
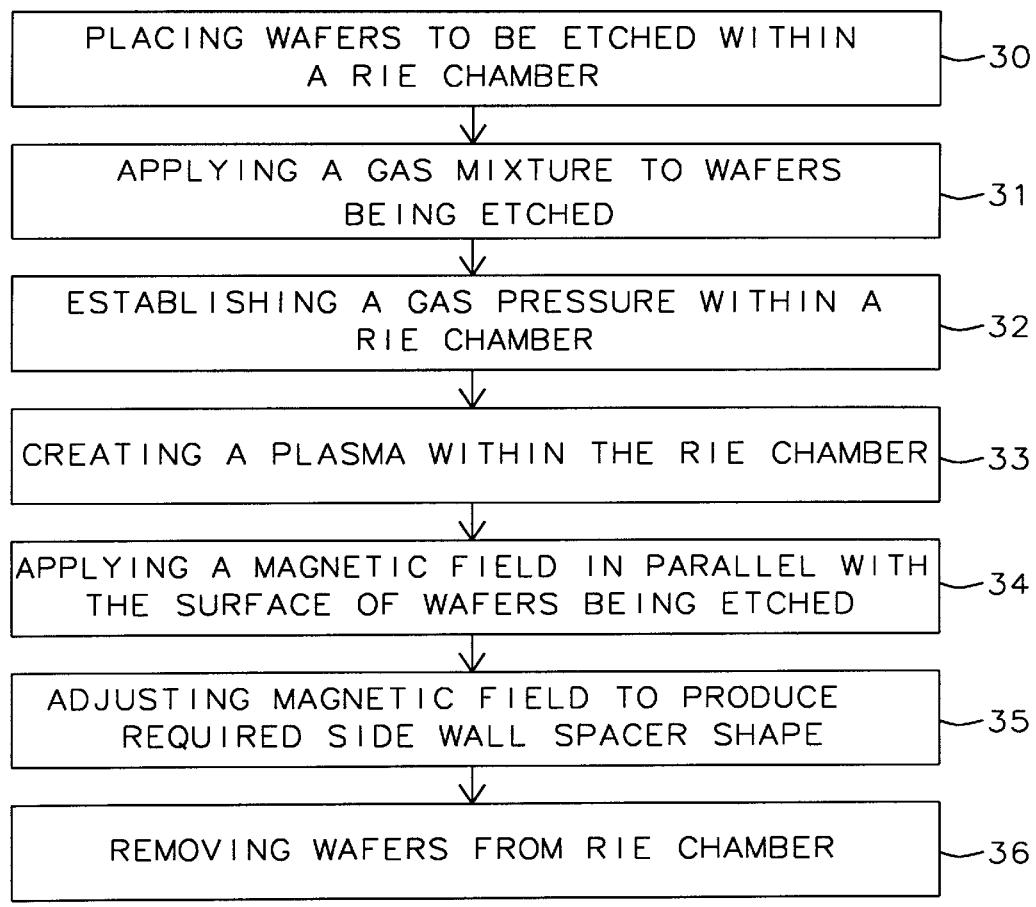
FIG. 3 is a flow diagram of the process to accurately etch side wall spacers.

In FIG. 3 is shown the diagram for the process to control side wall spacer etching. Wafers to be etched are placed within a RIE chamber 30. A gas mixture is applied to the wafers comprising an inert gas, and $CF_4$ and $CHF_3$ at a ratio R of between about 5 to about 9 at a gas flow rate of between about 100 to about 140 sccm 31. A pressure is established in the RIE chamber between about P=100 to about P=140 mT 32. A plasma is established within the gaseous mixture of between about 500 and about 900 watts 33. A magnetic field B of between about 15 to about 30 Gauss is applied parallel to the surface of the wafer being etched 34. The magnetic field is adjusted to established an oxide/silicon selectivity to produce the desired width of the side wall spacers 35. The magnetic field induces an etch rate that is higher at the edge of the wafer than at the center. The non-uniform etch rate compensates for the oxide thickness at the edge of the wafer being thicker than at the center. This results in the etched sidewall spacers being uniform across the surface of the wafer. The wafers are removed from the RIE chamber 36 with a uniform controlled spacer width 36.

While the invention has been particularly shown and described with reference to preferred embodiments thereof, it will be understood by those skilled in the art that various changes in form and details may be made without departing from the spirit and scope of the invention.

What is claimed is:

1. A method to control side wall spacer width, comprising:
    a) applying a gas mixture consisting of an inert gas and a mixture of $CF_4$ and $CHF_3$ in a controlled vacuum to a wafer with formed gate structures and a coating of oxide over the said gate structures,
    b) controlling pressure of said gas and establishing a plasma within said gas,
    c) applying a magnetic field parallel to the surface of the wafer being etched,
    d) adjusting magnitude of said magnetic field to control oxide/silicon selectivity,
    e) removing from the gas mixture and magnetic field said wafer having a controlled spacer width resulting from the oxide/silicon selectivity controlled by said magnetic field.

2. The method of claim 1, wherein applying a gas mixture is between about 100 to about 140 sccm of said inert gas and said mixture of $CF_4$ and $CHF_3$ with a ratio of between about 5:1 to about 9:1 of $CF_4$ and $CHF_3$ in a controlled pressure of between about 100 to about 140 milli-Torr.

3. The method of claim 1, wherein establishing said plasma requires between about 500 and about 900 watts.

4. The method of claim 1, wherein adjusting said magnetic field to between about 20 to about 30 Gauss in parallel with the surface of the wafer produces a controlled spacer width.

5. A method to selectively etch silicon oxide to produce a thickness of side wall spacers formed on the sides of gate structures of semiconductor devices, comprising:
    a) immersing a wafer having gate structures coated with a silicon oxide into a flow of between about 100 to about 140 sccm of a gas mixture comprising a mixture of an inert gas and a gas consisting of $CF_4$ and $CHF_3$ held at a ratio between about 5:1 to about 9:1,
    b) maintaining a controlled pressure of said gas mixture at between about 100 to about 140 milli-Torr,
    c) establishing a plasma of between about 500 to about 900 watts within said gas mixture,
    d) applying a magnetic field parallel to a surface of said wafer of between about 20 to about 30 Gauss,
    e) etching the silicon oxide coating of said wafer until a side wall is created.

6. The method of claim 5, wherein the magnetic field causes a higher etch rate at the edge of the wafer compensating for a thicker silicon oxide coating at the edge of the wafer.

7. The method of claim 5, wherein said side wall thickness is obtained from a oxide/silicon selectivity controlled by the intensity of the magnetic field.

8. The method of claim 7, wherein said selectivity decreases, increasing the side wall thickness as the intensity of the magnetic field is increased.

9. The method of claim 7, wherein said selectivity increases as the ratio of $CF_4$ to $CHF_3$ increases.

10. The method of claim 7, wherein said selectivity increases with increased pressure.

* * * * *